(12) United States Patent
Wang et al.

(10) Patent No.: US 10,705,664 B2
(45) Date of Patent: Jul. 7, 2020

(54) ARRAY SUBSTRATE FOR DISPLAY ASSEMBLY, DISPLAY ASSEMBLY AND ELECTRONIC EQUIPMENT

(71) Applicants: BEIJING BOE OPTOELECTRONICS TECHNOLOGY CO., LTD., Beijing (CN); BOE Technology Group Co., Ltd., Beijing (CN)

(72) Inventors: Yanming Wang, Beijing (CN); Rui Liu, Beijing (CN); Cuie Wang, Beijing (CN); Xi Chen, Beijing (CN); Desheng Xiang, Beijing (CN); Dawei Wang, Beijing (CN)

(73) Assignees: BEIJING BOE OPTOELECTRONICS TECHNOLOGY CO., LTD., Beijing (CN); BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 16/140,724

(22) Filed: Sep. 25, 2018

(65) Prior Publication Data

US 2019/0189644 A1      Jun. 20, 2019

(30) Foreign Application Priority Data

Dec. 15, 2017   (CN) .......................... 2017 1 1354130

(51) Int. Cl.
*G06F 3/044* (2006.01)
*H01L 27/12* (2006.01)
*G06F 3/041* (2006.01)
*H03K 17/96* (2006.01)

(52) U.S. Cl.
CPC .......... *G06F 3/0443* (2019.05); *G06F 3/0412* (2013.01); *G06F 3/0416* (2013.01); *G06F 3/04164* (2019.05); *H01L 27/1244* (2013.01); *H03K 17/9622* (2013.01); *G06F 2203/04107* (2013.01); *H03K 17/962* (2013.01); *H03K 2217/96066* (2013.01)

(58) Field of Classification Search
CPC ........... G06F 3/044; G06F 2203/04107; G06F 3/0412; G06F 3/0416; G06F 3/04886
See application file for complete search history.

(56) References Cited

U.S. PATENT DOCUMENTS

| | | | |
|---|---|---|---|
| 2010/0177058 A1* | 7/2010 | Lin .................... | G06F 3/044 345/174 |
| 2016/0291759 A1* | 10/2016 | Kurasawa ............. | G06F 3/0412 |
| 2017/0153725 A1* | 6/2017 | Park ..................... | G06F 3/0412 |
| 2018/0314386 A1* | 11/2018 | Tsai ..................... | G06F 3/0418 |

\* cited by examiner

*Primary Examiner* — Sanjiv D. Patel
(74) *Attorney, Agent, or Firm* — McDermott Will & Emery LLP

(57) ABSTRACT

In one embodiment, there is provided an array substrate for a display assembly. The display assembly includes a display region and a non-display region. The array substrate includes a first portion located in the display region and a second portion located in the non-display region, wherein a touch key subassembly is provided within the second portion. There is also provided a display assembly including the abovementioned array substrate and an electronic equipment including the display assembly.

18 Claims, 4 Drawing Sheets

ARRAY SUBSTRATE FOR DISPLAY ASSEMBLY, DISPLAY ASSEMBLY AND ELECTRONIC EQUIPMENT

CROSS-REFERENCE TO RELATED APPLICATION

This application claims priority to Chinese Patent Application No. 201711354130.5 filed on Dec. 15, 2017 in the State Intellectual Property Office of China, the disclosure of which is hereby incorporated by reference in its entirety.

TECHNICAL FIELD

The present disclosure relates to the technical field of communication equipment, and particularly, to an array substrate for a display assembly, a display assembly and an electronic equipment.

BACKGROUND

In a related art of electronic equipment, taking a mobile phone as an example, a touch key is disposed at the lower end frame of the mobile phone, which needs a separate mounting space and mounting of FPC (flexible circuit board), thereby reducing the screen-to-body ratio of the mobile phone and affecting the appearance of the mobile phone. In another related art, a touch key is displayed in the display area in the form of virtual key, but during the operation of the touch key, an area where the touch key of the display screen is located cannot perform the display function, thereby occupying the effective display area of the display screen, and affecting display effect of the display screen.

SUMMARY

According to an aspect of the present disclosure, there is provided an array substrate for a display assembly, the display assembly comprising a display region and a non-display region, the array substrate comprising a first portion located in the display region and a second portion located in the non-display region, wherein a touch key subassembly is provided within the second portion.

In one embodiment, the display assembly comprises an integrated circuit chip; and the touch key subassembly comprises: a first inductive capacitor; and a first connection line having one end that is electrically connected with the first inductive capacitor and the other end that is electrically connected with the integrated circuit chip.

In one embodiment, the array substrate further comprises a first ground line, wherein a first segment of the first ground line encircles the first inductive capacitor, a second segment of the first ground line is disposed around the first connection line, and the first connection line and the first ground line are covered with a protective glue.

In one embodiment, the first connection line comprises a wiring of a thin film transistor array.

In one embodiment, there are two touch key subassemblies spaced apart in a width direction of the array substrate, and the integrated circuit chip is between the two touch key subassemblies.

In one embodiment, the display assembly comprises a display integrated circuit and a touch integrated circuit independent of each other; and the touch key subassembly comprises: a second inductive capacitor; and a second connection line having one end that is electrically connected with the second inductive capacitor and the other end that is electrically connected with the touch integrated circuit.

In one embodiment, the array substrate further comprises a second ground line, wherein a first segment of the second ground line encircles the second inductive capacitor, a second segment of the second ground line is disposed around the second connection line, and the second connection line and the second ground line are covered with a protective glue.

In one embodiment, the second connection line comprises a wiring of a thin film transistor array.

According to another aspect of the present disclosure, there is provided a display assembly comprising: an integrated circuit chip; the array substrate for the display assembly, according to any one of the abovementioned embodiments, to which the integrated circuit chip is connected; an opposite substrate; and a protective board; wherein the protective board is attached to one side of the opposite substrate, and the array substrate is attached to the other side of the opposite substrate.

In one embodiment, the touch key subassembly comprises: a first inductive capacitor; and a first connection line having one end that is electrically connected with the first inductive capacitor and the other end that is electrically connected with the integrated circuit chip.

11. The display assembly of claim 10, wherein the array substrate further comprises a first ground line, wherein a first segment of the first ground line encircles the first inductive capacitor, a second segment of the first ground line is disposed around the first connection line, and the first connection line and the first ground line are covered with a protective glue.

In one embodiment, the first connection line comprises a wiring of a thin film transistor array.

In one embodiment, there are two touch key subassemblies spaced apart in a width direction of the array substrate, and the integrated circuit chip is between the two touch key subassemblies.

In one embodiment, the integrated circuit chip comprises a display integrated circuit and a touch integrated circuit independent of each other, wherein the touch key subassembly comprises: a second inductive capacitor; and a second connection line having one end that is electrically connected with the second inductive capacitor and the other end that is electrically connected with the touch integrated circuit.

In one embodiment, the array substrate further comprises a second ground line, wherein a first segment of the second ground line encircles the second inductive capacitor, a second segment of the second ground line is disposed about the second connection line, and the second connection line and the second ground line are covered with a protective glue.

In one embodiment, the second connection line comprises a wiring of a thin film transistor array.

In one embodiment, the display assembly may further comprise a packing layer that is between the protective board and the array substrate and that comprises the protective glue and a packing material.

In one embodiment, the display assembly may further comprise a packing layer that is between the protective board and the array substrate and that comprises the protective glue and a packing material.

According to a yet another aspect of the present disclosure, there is provided a electronic equipment comprising the display assembly of any one of the abovementioned embodiment.

BRIEF DESCRIPTION OF THE DRAWINGS

The above and/or additional aspects and advantages of the present disclosure will become apparent and readily understood from the description of the embodiments hereinafter in conjunction with the following drawings, in which.

DETAILED DESCRIPTION OF THE EMBODIMENTS

Figure 1:
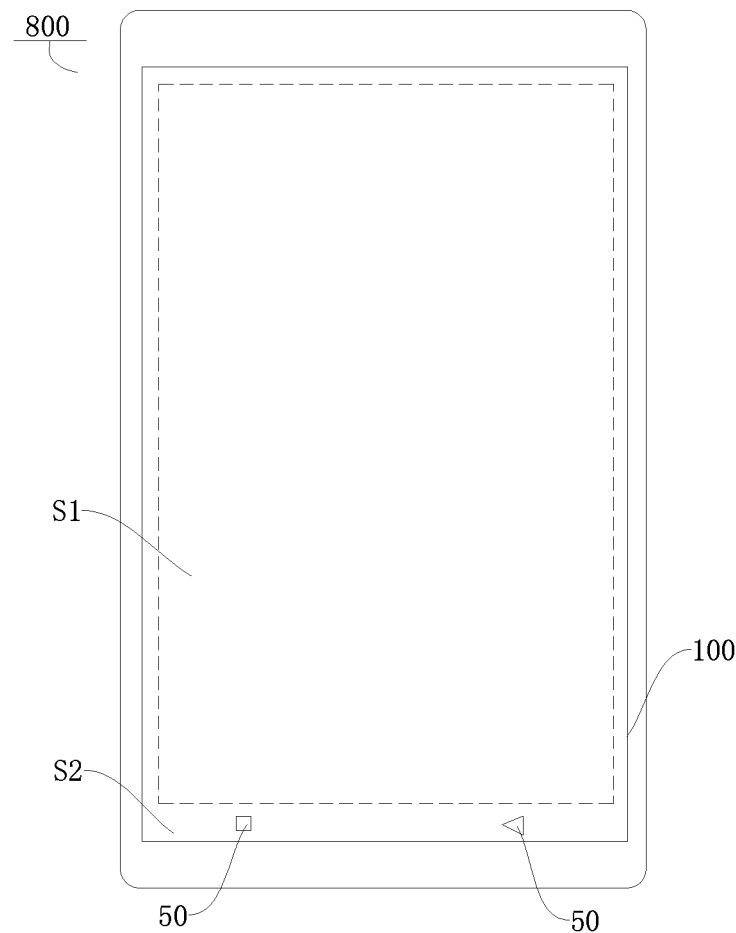
FIG. 1 is a schematic view showing an overall structure of an electronic equipment according to an embodiment of the present disclosure.

The embodiments of the present disclosure will be described in detail below, and the examples of the embodiments are illustrated in the drawings, wherein the same or similar reference numerals are used to refer to the same or similar elements or elements having the same or similar functions. The embodiments described below with reference to the accompanying drawings are intended to be illustrative only, and are not to be construed as limiting the present disclosure.

In the description of the present disclosure, it is to be understood that orientations or positional relationships indicated by the terms "center", "length", "width", "thickness", "upper", "lower", "front", "back", "left", "right", "top", "bottom", "inside", "outside", etc., are based on the orientations or positional relationships shown in the drawings, for the convenience of describing the present disclosure and simplifying the description, rather than indicating or implying that the devices or elements referred to have particular orientations, and are constructed and operated in particular orientations, and are therefore not to be construed as limiting the present disclosure. In addition, feature defining "first" or "second" may include one or more of the features, either explicitly or implicitly. In the description of the present disclosure, the meaning of "a plurality of" is two or more unless otherwise specified.

In the description of the present disclosure, it should be noted that, unless otherwise specified, the terms "mount", "connect to", and "connect with" should be understood broadly, for example, it may be a fixed connection, or a detachable connection, or else an integral connection; or it may be a mechanical connection or an electrical connection; or it may be a direct connection, or an indirect connection through an intermediate medium, or else an internal communication of two elements. The specific meanings of the above terms in the present disclosure can be understood in the specific circumstances by those skilled in the art.

Figure 2:
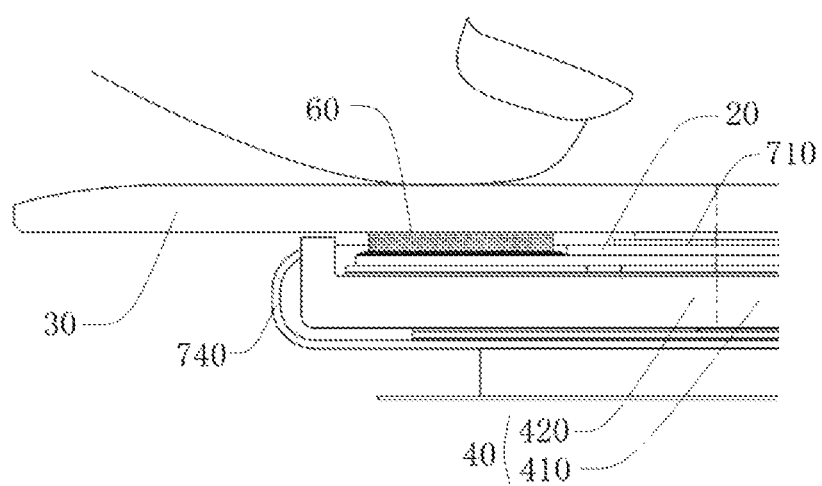
FIG. 2 is a schematic view showing a partial structure of an electronic equipment according to an embodiment of the present disclosure.

FIG. 1 is a schematic view showing an overall structure of an electronic equipment, taking a mobile phone as an example, according to an embodiment of the present disclosure; FIG. 2 is a schematic view which shows a partial structure of the electronic equipment shown in FIG. 1 and in which a cross-sectional structure of an area, at the lower left end of the electronic equipment of FIG. 1, where a touch key subassembly 50 is located, is schematically shown. FIG. 3 to FIG. 7 are schematic views which respectively show partial structures of a display assembly according to various embodiments of the present disclosure, and in each of which an internal structure of an area, at the lower left end of the electronic equipment of FIG. 1, where the touch key subassembly 50 is located, is schematically shown.

An array substrate 40 for a display assembly 100 according to embodiments of the present disclosure will be described below with reference to FIG. 1 to FIG. 7.

As shown in FIG. 1 to FIG. 7, in the array substrate 40 for the display assembly 100 according to embodiments of the present disclosure, the display assembly 100 comprises a display region S1 and a non-display region S2. It should be noted that, the display region S1 can be used to display information about an electronic equipment 800, such as menus, applications, and information outputted after related application is turned on. In addition, a user can also input relevant information to the electronic equipment 800 through the display region S1, to realize the interaction between the user and the electronic equipment 800.

The array substrate 40 comprises a first portion 410 located in the display region S1 and a second portion 420 located in the non-display region S2, and the touch key subassembly 50 is provided within the second portion 420. It should be noted that the array substrate 40 may be a TFT (Thin Film Transistor) substrate, and wirings and related components of the display assembly 100 may be arranged on the array substrate 40. It can be understood that, by providing the touch key subassembly 50 on the second portion 420, the touch key subassembly 50 can be located within the non-display region S2 of the display assembly 100, thereby preventing the touch key subassembly 50 from affecting the display region S1 of the display assembly 100. Moreover, by providing the touch key subassembly 50 on the second portion 420 of the array substrate 40, the space of the non-display region S2 of the display assembly 100 can be fully utilized, and no separate assembly space needs to be occupied by the display assembly 100. As a result, the structure of the display assembly 100 is more compact, the distance between the display region S1 and the lower end of the electronic equipment 800 (such as the bottom of the paper in FIG. 1) is shortened, and the screen-to-body ratio of the electronic equipment 800 including the display assembly 100 is increased.

In the display assembly 40 for the display assembly 100 according to embodiments of the present disclosure, by providing the touch key subassembly 50 on the second portion 420 of the array substrate 40 within the non-display region S2, the display region S1 can be prevented from be affected by the touch key subassembly 50, and the space of non-display region S2 of the display assembly 100 can be fully utilized, such that no additional mounting space is required to be provided for the touch key subassembly 50, thereby enabling the display assembly 100 more compact in structure and effectively increasing the screen-to-body ratio of the electronic equipment 800.

According to some embodiments of the present disclosure, the display assembly 100 comprises an integrated circuit (IC) chip 10. As shown in FIG. 3 to FIG. 6, the touch key subassembly 50 may comprise: a first inductive capacitor 510a; and a first connection line 520a having one end that is electrically connected with the first inductive capacitor 510a and the other end that is electrically connected with the integrated circuit chip 10. Thus, the touch key subassembly 50 can realize a two-way communication with the integrated circuit chip 10 through the first connection line 520a, that is, information can be transmitted from the touch key subassembly 50 to the integrated circuit chip 10, and the integrated circuit chip 10 can also drive and control the touch key subassembly 50. Moreover, by connecting the touch key subassembly 50 to the integrated circuit chip 10, the touch key subassembly 50 and the display assembly 100 can share the same integrated circuit chip 10, thereby making the structure of the electronic equipment 800 more compact, which is convenient for optimizing the layout of the touch key subassembly 50.

It should be noted that, the display assembly 100 may be an assembly for a thin film transistor display device, and the first connection line 520a may be a wiring of a thin film transistor array (also referred to as a panel array wiring). It should be noted that, a thin film transistor may include components including a gate electrode, a gate insulation layer, a semiconductor layer, a source electrode and a drain electrode. By connecting the integrated circuit chip 10 with the wiring of the thin film transistor array, on or off of communication between the source electrode and the drain electrode can be controlled by changing a voltage applied to the gate electrode, thereby controlling on or off of connection between the second connection line 520b and the integrated circuit chip 10. Moreover, the first connection line 520a is connected to the integrated circuit chip 10 via the wiring of the thin film transistor array, which can eliminate the bonding and the connector used otherwise when the first connection line 520a is connected to the integrated circuit chip 10 by using the FPC (flexible circuit board) in the related art, reduce production cost and the mounting space of the touch key subassembly 50 in the thickness direction of the electronic equipment 800, so that the display assembly 100 has high integration and a more compact structure, and a reliable and stable connection between the first inductive capacitor 510a and the integrated circuit chip 10 can be improved.

According to some embodiments of the present disclosure, the first portion 410 of the array substrate 40 has a length of L1, an opposite substrate 20 has a length of L2, and L1 $\geq$ L2. It can be understood that, by setting L1 $\geq$ L2, the total length of the array substrate 40 (i.e., the sum of the lengths of the first portion 410 and the second portion 420) can be made larger than the length of the opposite substrate 20, that is, the array substrate 40 can extend beyond the opposite substrate 20 in the length direction, and the second portion 420 of the array substrate 40 has a single-layer structure, so that the array substrate provides an mounting space for the touch key subassembly 50, thereby facilitating the assembly and wiring of the touch key subassembly 50. In addition, the second portion 420 of the array substrate 40, being in the single-layer structure, can also facilitate the layout and routing of the display assembly 100. In a specific example of the present disclosure, the opposite substrate 20 is a glass substrate, the first portion 410 of the array substrate 40 has a length of L1, the glass substrate has a length of L2, and L1 $\geq$ L2. It can be understood that, by setting L1 $\geq$ L2, the total length of the array substrate 40 can be made larger than the length of the glass substrate, that is, the array substrate 40 can extend beyond the glass substrate in the length direction.

According to some embodiments of the present disclosure, as shown in FIG. 3 to FIG. 6, the array substrate 40 further comprises a first ground line 760, a first segment of the first ground line encircles the first inductive capacitor 510a, and a second segment of the first ground line is disposed around the first connection lines 520a. That is to say, the first ground line 760 is disposed to surround the touch area, to separate the wirings in the touch area from other wirings in the array substrate 40. The first connection line 520a and the first ground line 760 are covered with a protective glue. The protective glue (such as UV optical glue, Tuffy glue or 3M fluoride) can be applied to an area where line(s) is/are exposed so as to prevent scratching and corrosion of the first connection line 520a and the ground line 760 in the area or portion having a single-layer structure. When applying protective glue, a protective glue of appropriate dielectric constant is chosen to allow the protective glue to cover the line evenly and prevent bubbles from being generated.

According to some embodiments of the present disclosure, the array substrate 40 further comprises an Electro-Static Discharge (ESD) wiring. A segment of the ESD wiring encircles the first inductive capacitor 510a, thereby improving the antistatic effect of the electronic equipment 800. It can be understood that, in order to further improve the antistatic effect of the electronic equipment 800, a plurality of ESD wirings can be disposed around the second capacitor 510b. In some embodiments of the present disclosure, there can be a plurality of the touch key subassemblies 50. Thereby, versatility of the functions of the touch key subassembly 50 can be improved, for example, the touch key subassemblies 50 can include a "return key", a "menu key", a "home key", etc., thereby improving versatility of the functions of the touch key subassembly 50 by providing a plurality of touch key subassemblies 50. As a result, the electronic equipment 800 is easier to be operated, thereby improving the overall performance of the electronic equipment 800.

According to some embodiments of the present disclosure, there can be two touch key subassemblies 50 spaced apart along a width direction of the array substrate 40. It can be understood that, although the second portion 420 of the array substrate 40 has a limited space, two touch key subassemblies 50 can be assembled on the second portion 420 after optimizing the layout of the second portion 420. For example, the two touch key subassemblies 50 can be any two of a "menu key", a "return key" and a "home key", or one touch key subassembly 50 may have different functions by controlling the duration time of pressing the key. As shown in FIG. 1, the two touch key subassemblies 50 are respectively a "menu key" and a "return key", and the two touch key subassemblies 50 are spaced apart along the width direction of the array substrate 40.

Furthermore, the integrated circuit chip 10 is provided between the two touch key subassemblies 50, which facilitates the connections between the two touch key subassemblies 50 and the integrated circuit chip 10, as well as the layout and optimization of wirings of the touch key subassemblies 50 and the integrated circuit chip 10.

Figure 7:
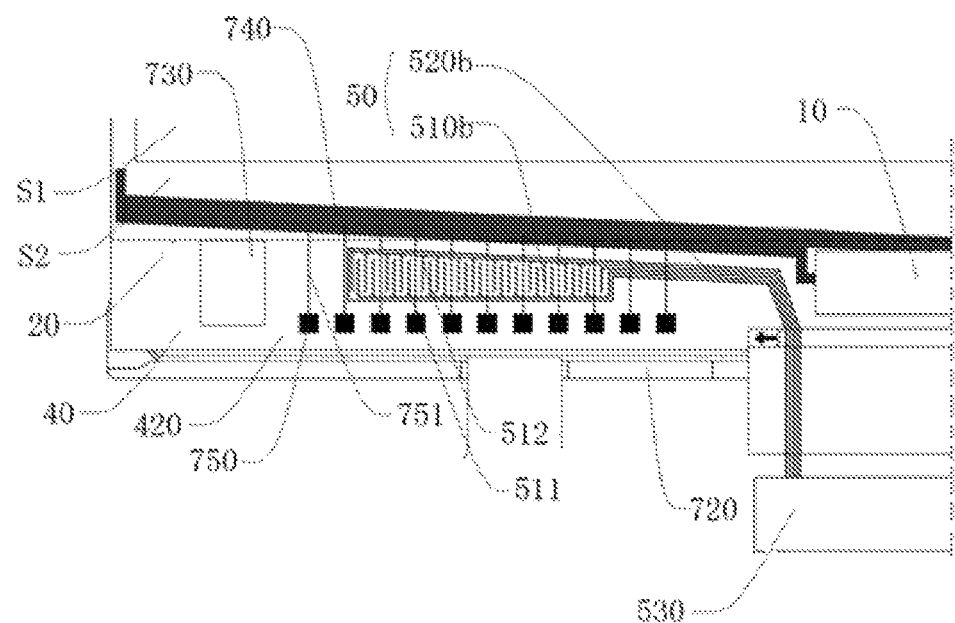
FIG. 7 is a schematic view showing a partial structure of a display assembly according to a still another embodiment of the present disclosure.

According to some embodiments of the present disclosure, as shown in FIG. 7, the display assembly 100 comprises a display integrated circuit 10 and a touch integrated circuit 530, and the touch key subassembly 50 comprises: a second inductive capacitor 510b; and a second connection line 520b having one end that is electrically connected with the second inductive capacitor 510b and the other end that is electrically connected with the touch integrated circuit 530. Thus, the second inductive capacitor 510b can realize a two-way communication with the touch integrated circuit 530 through the second connection line 520b, that is, information can be transmitted from the second inductive capacitor 510b to the touch integrated circuit 530, and the touch integrated circuit 530 can also drive and control the touch key subassembly 50. Moreover, provision of the separate touch integrated circuit 530 is advantageous for improving the reliability and stability of the operation of the touch key subassembly 50. As shown in FIG. 7, the array substrate 40 further comprises a second ground line 760, a first segment of the second ground line encircles the second inductive capacitor 510b, and a second segment of the second ground line is disposed around the second connection lines 520b. That is to say, the second ground line 760 is disposed at the periphery of the touch area, to separate the wirings in the touch area from other wirings in the array substrate 40. The second connection line 520b and the second ground line 760 are covered with a protective glue. The protective glue (such as UV optical glue, Tuffy glue or 3M fluoride) can be applied to an area where line(s) is/are exposed so as to prevent scratching and corrosion of the second connection line 520b and the second ground line 760 in the area or portion having a single-layer structure. When applying protective glue, a protective glue of appropriate dielectric constant is chosen to allow the protective glue to cover the line evenly and prevent bubbles from being generated.

It should be noted that, the second connection line 520b may be a wiring of a thin film transistor array (also referred to as a panel array wiring). It should be noted that, the thin film transistor may include components including a gate electrode, a gate insulation layer, a semiconductor layer, a source electrode and a drain electrode. By connecting the touch integrated circuit 530 with the wiring of the thin film transistor array, on or off of communication between the source electrode and the drain electrode can be controlled by changing the voltage applied to the gate electrode, thereby controlling on or off of connection between the second connection line 520b and the integrated circuit chip 10. Moreover, the second connection line 520b is connected to the touch integrated circuit 530 via the wiring of thin film transistor array, which can eliminate the bonding and the connector used otherwise when the second connection line is connected to the integrated circuit chip by using the FPC (flexible circuit board) in the related art, reduce production cost and the mounting space of the touch key subassembly 50 in the thickness direction of the electronic equipment 800, so that the display assembly 100 has high integration and a more compact structure, and a reliable and stable connection between the second inductive capacitor 510b and the touch integrated circuit 530 can be improved.

According to some embodiments of the present disclosure, similarly, a segment of the ESD wiring encircles the second inductive capacitor 510b, thereby improving the antistatic effect of electronic equipment 800. It can be understood that, in order to further improve the antistatic effect of the electronic equipment 800, a plurality of ESD wirings can be disposed around the second capacitor 510b.

Figure 3:
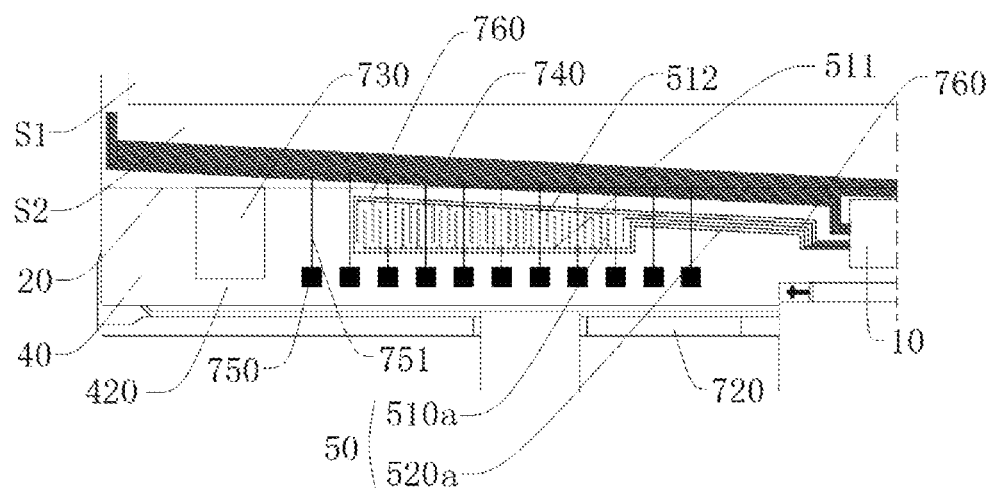
FIG. 3 is a schematic view showing a partial structure of a display assembly according to an embodiment of the present disclosure.
Figure 4:
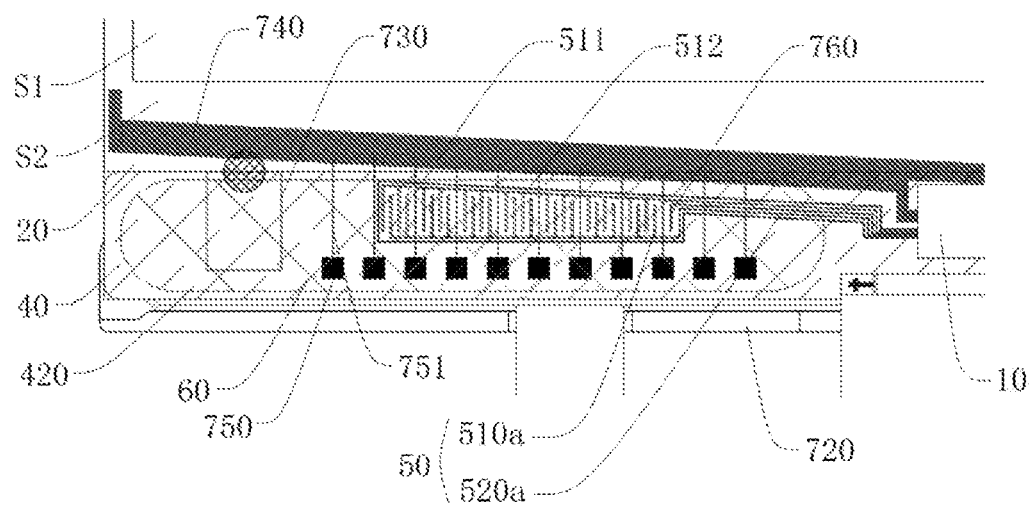
FIG. 4 is a schematic view showing a partial structure of a display assembly according to an embodiment of the present disclosure.
Figure 6:
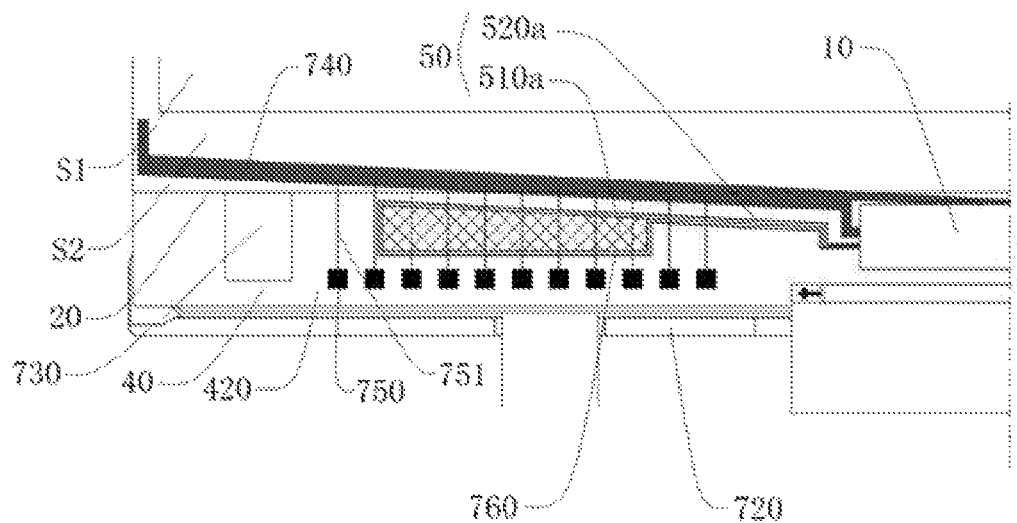
FIG. 6 is a schematic view showing a partial structure of a display assembly according to a yet another embodiment of the present disclosure.

According to some other embodiments of the present disclosure, the touch key subassembly 50 may adopt a mutual capacitance type touch key, or else adopt a self capacitance type touch key. Referring to FIG. 3 and FIG. 4, the touch key subassembly 50 adopts a mutual capacitance type touch key, and the first inductive capacitor 510a comprises a Rx (Receive) electrode 512 and a Tx (Transmit) electrode 511. A first segment of the ground line 760 encircles the touch area, while a second segment of the ground line 760 is disposed around/among the wirings (namely first connection lines) of the Rx (Receive) electrode 512 and the Tx (Transmit) electrode 511 within the non-touch area, to surround them but separate them from each other. The touch key subassembly 50 can achieve sliding touch function through multiple pairs of gate capacitors. As shown in FIG. 6, the touch key subassembly 50 adopts a self capacitance type touch key, and the ground line 760 is provided to surround the touch area as well as the wiring of the second inductive capacitor 520a.

According to embodiments of the present disclosure, referring to FIG. 1 to FIG. 3, the display assembly 100 comprises: the integrated circuit chip 10, the opposite substrate 20, a protective board 30, the array substrate 40 and the touch key subassembly 50.

Specifically, the array substrate 40 is electrically connected to the integrated circuit chip 10, whereby a two-way communication between the array substrate 40 and the integrated circuit chip 10 can be realized. It should be noted that the array substrate 40 can be used to display the relevant output information of the electronic equipment 800, and the integrated circuit chip 10 can drive and control the array substrate 40. By controlling the display content of the array substrate 40, the display assembly 100 is controlled correspondingly to implement a corresponding display function. The protective board 30 is attached to one side of the opposite substrate 20, whereby the protective board 30 can prevent the opposite substrate 20 from being damaged by wear and thus affecting the display effect of the display assembly 100, thereby prolonging the service life of display assembly 100.

As shown in FIG. 2, the protective board 30 can be disposed on an outer side of the opposite substrate 20 facing away from the array substrate 40, while the array substrate 40 is attached to the other side of the opposite substrate 20. The array substrate 40 includes the first portion 410 and the second portion 420, the first portion 410 is located within the display region S1 of the display assembly 100 as shown in FIG. 1, and the second portion 420 is located within the non-display region S2 of the display assembly 100 as shown in FIG. 1.

In the display assembly according to embodiments of the present disclosure, by providing the touch key subassembly 50 on the second portion 420 of the array substrate 40 within the non-display region S2, the influence of the touch key subassembly on the display region S1 can be avoided, and the space of non-display region S2 of the display assembly 100 can be fully utilized. No additional mounting space is required for the touch key subassembly 50, which makes the display assembly 100 more compact in structure and effectively increases the screen-to-body ratio of the electronic equipment 800.

According to some embodiments of the present disclosure, the display assembly 100 can further comprise a packing layer 60 that is located between the protective board 30 and the array substrate 40, to fix the touch key subassembly 50 to the array substrate 40. The packing layer 60 can be made of a material such as silicone rubber OCA (Optical Clear Adhesive), and the packing layer 60 can be filled between the array substrate 40 and the protective board 30. In order to ensure that the touch key subassembly 50 has good reaction sensitivity, the performance (e.g., electrical constant) of the packing layer 60 can be modified accordingly. The packing layer 60 may include the aforementioned protective glue and a packing material. It can be understood that, by providing the packing layer 60, the structural stability of the touch key subassembly 50 can be improved, and the wirings of the array substrate 40 and the touch key subassembly 50 can be fixed, which effectively prevents the components and the wirings from interfering with each other.

An electronic equipment 800 according to embodiments of the present disclosure comprises the abovementioned display assembly 100.

In the electronic equipment 800 according to embodiments of the present disclosure, by providing the touch key subassembly 50 on the second portion 420 of the array substrate 40 within the non-display region S2, the display region S1 can be prevented from be affected by the touch key subassembly 50, and the space of non-display region S2 of the display assembly 100 can be fully utilized, such that no additional mounting space is required to be provided for the touch key subassembly 50, thereby enabling the display assembly 100 more compact in structure and effectively increasing the screen-to-body ratio of the electronic equipment 800.

In some embodiments of the present disclosure, the touch key subassembly 50 is located at the lower end of the electronic equipment 800. Thereby, it is convenient for the user to operate the touch key subassembly 50. It can be understood that when the user holds the electronic equipment 800, the user's thumb can be placed on the front side of the electronic equipment 800 and close to the lower end of the electronic equipment 800. By placing the touch key subassembly 50 on the lower end of the electronic equipment 800, it is convenient for the user to perform operation and control on the touch key subassembly 50. In addition, location of the touch key subassembly 50 at the lower end of the electronic equipment 800 can improve the aesthetic appearance of the electronic equipment 800.

In some embodiments of the present disclosure, the display assembly 100 may comprise an integrated circuit chip 10 and a touch chip. The integrated circuit chip 10 may be a driving chip (e.g., display integrated circuit) for driving the display assembly 100 to perform a display function. The integrated circuit chip 10 can be thermally bonded to the array substrate 40 (such as a TFT substrate) by an ACF (Anisotropic Conductive Film), and the touch chip (e.g., touch integrated circuit) can be an external touch chip that is connected to the array substrate 40 and implements the touch function of the display assembly 100. In addition, the touch key subassembly 50 can be connected to the touch chip through a FPC to implement the touch function of the touch key subassembly 50.

In some other embodiments of the present disclosure, the integrated circuit chip 10 may integrate the driving chip and the touch chip, that is, the integrated circuit chip 10 can adopt a TDDI (Touch and Display Driver Integration) chip, and the integrated circuit chip 10 can be thermally bonded to the array substrate 40 (such as a TFT substrate) by an ACF (Anisotropic Conductive Film). Thus, the integrated circuit chip 10 can drive the display assembly 100 and also can implement the touch function of the display assembly 100. In addition, the touch key assembly 50 is connected to the integrated circuit chip 10, and the integrated circuit chip can drive the touch key subassembly 50 to achieve the touch function of the touch key subassembly 50.

It should be noted that "electronic equipment 800" as used herein includes, but is not limited to, a device configured for receiving/transmitting a communication signal via a wired connection (for example, public switched telephone network (PSTN), a digital subscriber line (DSL), a digital cable, a direct cable connection, and/or another data connection/network) and/or via wireless interface (for example, cellular networks, wireless local area networks (WLANs), digital television networks such as DVB-H networks, satellite networks, AM-FM broadcast transmitters, and/or a wireless interface of another communication terminal). Examples of the electronic equipment 800 include, but are not limited to, a satellite or a cellular telephone; a personal communication system (PCS) terminal that combines a cellular radio telephone with data processing, fax and data communication capabilities; PDAs including radio telephones, pagers, Internet/intranet access, Web browsers, notebooks, calendars, and/or global positioning system (GPS) receivers; and conventional laptop and/or palmtop receivers or other electronic devices including radio telephone transceivers.

The electronic equipment 800 may be any device capable of acquiring data from the outside and processing the data, or the electronic equipment 800 may be any device that has a built-in battery and is capable of taking current from the outside to charge the battery, for example, a mobile phone (such as the embodiment shown in FIG. 1), a tablet computer, a computing device or an information display device, or the like. The mobile phone is only an example of the electronic equipment 800. The present disclosure is not limited to the above, and the present disclosure is applicable to electronic equipment 800 such as a mobile phone, a tablet computer, etc., which is not particularly limited here.

In the embodiments of the present disclosure, the electronic equipment according to the present disclosure, by taking a mobile phone as an example, may include a radio frequency circuit, a memory, an input module, a wireless fidelity (WiFi) module, the display assembly 100, a sensor, an audio circuit, a processor, a fingerprint identification module, power supply and other components.

The radio frequency circuit can be used for receiving and transmitting signals during the transmission and reception of information or a call, in particular, transmitting downlink information from a base station to the processor after receiving it, moreover, transmitting uplink information from the electronic equipment according to the present disclosure, by taking a mobile phone as an example, to the base station. Typically, the radio frequency circuit includes, but is not limited to, an antenna, at least one amplifier, a transceiver, a coupler, a low noise amplifier, a duplexer, and the like. In addition, the radio frequency circuit can communicate with the network and other devices through wireless communication.

The memory can be used to store software programs and modules, and the processor executes various functional applications and data processing of the electronic equipment according to the present disclosure, by taking a mobile phone as an example, by running software programs and modules stored in the memory. The memory may mainly include a program storage area and a data storage area, wherein the program storage area may store an operating system, an application required for at least one function (such as a sound playing function, an image playing function, etc.), and the data storage area may store data (such as audio data, phone book, etc.) created by the electronic equipment according to the present disclosure, by taking a mobile phone as an example. In addition, the memory may include a high speed random access memory, and may also include a nonvolatile memory such as at least one magnetic disk storage device, flash memory device, or other volatile solid state storage device.

The input module can be used to receive input numeric or character information, and to generate key signals related to user settings and function control of the electronic equipment according to the present disclosure, by taking a mobile phone as an example. Specifically, the input module may include a touch panel and other input devices. A touch panel, also referred to as a touch screen, collects touch operations done on or near itself by a user (e.g., the user uses any suitable object or accessory including a finger, a stylus, or the like, to perform operations on or near the touch panel), and a related connection device is driven according to a preset program.

According to some embodiments of the present disclosure, the touch panel may include two parts, including a touch detection device and a touch controller. The touch detection device detects the touch orientation of the user, and detects a signal brought by the touch operation, and transmits the signal to the touch controller. The touch controller receives the touch information from the touch detection device, converts the touch information into contact coordinates and sends them to the processor, and receives commands from the processor and execute them. In addition, the touch panels can be implemented in various types such as resistive type, capacitive type, infrared type, surface acoustic wave type, and the like. In addition to the touch panel, the input module may also include other input devices. Specifically, other input devices may include, but are not limited to, one or more of a physical keyboard, a function key (such as a volume control key, a switch key, etc.), a trackball, a mouse, a joystick, and the like.

The display assembly 100 may include a display panel. In some embodiments, the display panel can be configured in the form of a Liquid Crystal Display (LCD), an Organic Light-Emitting Diode (OLED), or the like. Further, the touch panel may cover the display panel. When the touch panel detects a touch operation on or near itself by a touch event, it transmits a signal indicative of the operation to the processor so that the type of the touch event is determined, and then the processor provides related visual output on the display panel according to the type of the touch event.

The audio circuitry, a speaker and a microphone may provide an audio interface between the user and the electronic equipment according to the present disclosure, by taking a mobile phone as an example. The audio circuit can transmit the converted electrical signal of the received audio data to the speaker, and the speaker converts it into a sound signal and output the sound signal. On the other hand, the microphone converts the collected sound signal into an electrical signal, which is received by the audio circuit and converted into audio data. And the audio data is output to the processor and is processed by the processor, and then is sent to another electronic equipment, such as another mobile phone, via the radio frequency circuit; or the audio data is output to a memory for further processing.

WiFi is a short-range wireless transmission technology. The electronic equipment according to the present disclosure, by taking a mobile phone as an example, can help users to send and receive emails, visit websites and access streaming media through the WiFi module, and the WiFi module provides wireless broadband Internet access for users. However, it is to be understood that the WiFi module does not belong to the essential configuration of the electronic equipment according to the present disclosure, by taking a mobile phone as an example, and may be omitted as needed within the scope of not changing the essence of the electronic equipment.

The processor is a control center of the electronic equipment according to the present disclosure, by taking a mobile phone as an example. The processor is installed on a circuit board assembly, and connects various parts of the entire mobile phone by using various interfaces and lines, and performs various functions and processing data of the mobile phone by running or executing software programs and/or modules stored in the memory, as well as invoking data stored in memory, thereby providing overall monitoring of the electronic equipment according to the present disclosure, by taking a mobile phone as an example. In some embodiments, the processor may include one or more processing units; for example, the processor may integrate an application processor and a modem processor, the application processor primarily processes an operating system, a user interface, an application, and the like, and the modem processor primarily handles wireless communications.

The power supply can be in logic connection to the processor through a power management system, which manages functions such as charging, discharging, and power consumption management of the power supply. Although not shown, the electronic equipment according to the present disclosure, by taking a mobile phone as an example, may further include a Bluetooth module, a sensor (such as an attitude sensor, a light sensor, and other sensors including a barometer, a hygrometer, a thermometer, and an infrared sensor), which is not described herein for the sake of brevity.

The display assembly 100 according to embodiments of the present disclosure will be described in detail below with reference to FIGS. 1-7 in three exemplary embodiments. It is to be understood that the description hereinafter is merely illustrative and is not constructed to limit the present disclosure.

In an exemplary embodiment shown in FIG. 1 to FIG. 4, the display assembly 10 includes a display region S1 and a non-display region S2. The display assembly 100 comprises: an integrated circuit chip 10, an opposite substrate 20, a protective board 30, an array substrate 40, a polarizer 710, a backlight source 720, a silver paste PAD 730, a fan out wiring 740, an ET (Explore Testing) PAD 750, an ET PAD wiring 751, a ground line 760, a touch key subassembly 50 and a packing layer 60.

Referring to FIG. 2, the protective board 30, the opposite substrate 20 and the array substrate 40 are stacked sequentially. An OCA (Optical Clear Adhesive) or OCR (Optical Clear Resin) bonding may be adopted for optical jointing between the protective board 30 and the opposite substrate 20, and the array substrate 40 is electrically connected to the integrated circuit chip 10 via the fan out wiring 740, (for example, see FIG. 3). The array substrate 40 is a TFT (Thin Film Transistor) substrate, and the opposite substrate 20 is a glass substrate. The array substrate 40 includes a first portion 410 located in the display region S1 and a second portion 420 located in the non-display region S2. The first portion 410 has a length of L1, the opposite substrate 20 has a length of L2, and L1 ≥ L2.

The second portion 420 of the array substrate 40 goes or extending out of the opposite substrate 20 in a length direction and has a single layer structure. The touch key subassembly 50 is provided on the second portion 420 of the array substrate 40. In order to avoid the edges of the opposite substrate 20 and the array substrate 40 from scratching the fan out wiring 740 and the touch key subassembly 50, the touch key subassembly 50 and the fan out wiring 740 are provided at positions away from the edges of the opposite substrate 20 and the array substrate 40. There are two touch key subassemblies 50, and the two touch key subassemblies 50 are spaced apart along a width direction of the array substrate 40.

The touch key subassembly 50 adopts a mutual capacitance type touch key. The touch key subassembly 50 comprises a first inductive capacitor 510a and a first connection line 520a. The first inductive capacitor 510a comprises a Tx electrode 512 and a Rx electrode 511. The first connection line 520a has one end that is electrically connected with the first inductive capacitor 510a and the other end that is electrically connected with the integrated circuit chip 10. The integrated circuit chip 10 is located between the two touch key subassemblies 50. The packing layer 60 is provided between the protective board 30 and the array substrate 40, to fix the wirings of the touch key subassemblies 50 and the display assembly 100 to the array substrate 40. A first segment of the first ground line 760 encircles the first inductive capacitor 510a, a second segment of the first ground line 760 is disposed around the first connection line 520a, and the first connection line 520a and the first ground line 760 are covered with a protective glue (as indicated by wide diagonal dotted line shown in FIG. 4).

Therefore, by providing the touch key subassembly 50 on the second portion 420 of the array substrate 40 within the non-display region S2, the display region S1 can be prevented from be affected by the touch key subassembly 50, and the space of non-display region S2 of the display assembly 100 can be fully utilized, such that no additional mounting space is required to be provided for the touch key subassembly 50, thereby enabling the display assembly 100 more compact in structure and effectively increasing the screen-to-body ratio of the electronic equipment 800.

Figure 5:
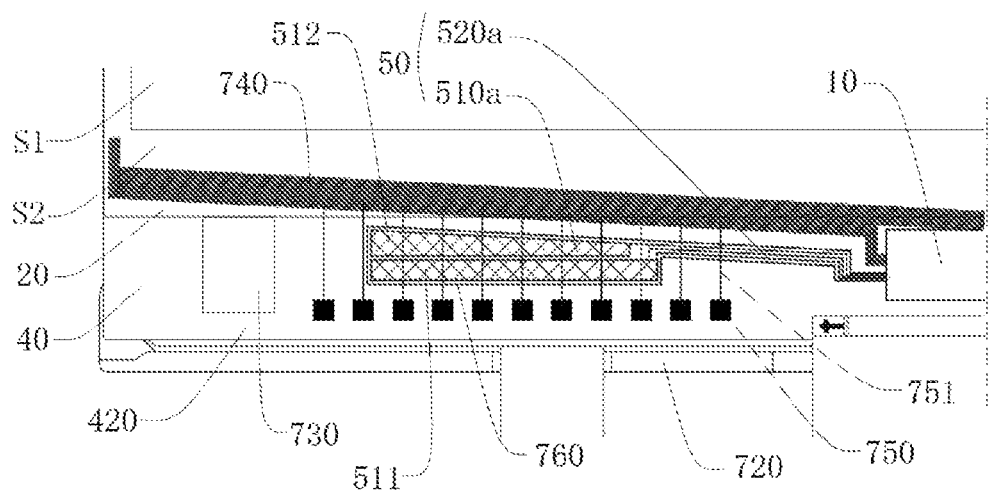
FIG. 5 is a schematic view showing a partial structure of a display assembly according to another embodiment of the present disclosure.

Unlike the exemplary embodiment shown in FIG. 1 to FIG. 4, in an exemplary embodiment shown in FIG. 5, the Tx electrode 512 and the Rx electrode 511 have different layouts of wirings. In the exemplary embodiment shown in FIG. 1 to FIG. 4, the Tx electrodes 512 and the Rx electrodes 511 are staggered with each other; while in the exemplary embodiment shown in FIG. 5, the Tx electrodes 512 and the Rx electrodes 511 are arranged in two different rows. Accordingly, the diversity of the layout of wirings in the display assembly 100 can be improved.

Unlike the exemplary embodiment shown in FIG. 1 to FIG. 4, in an exemplary embodiment shown in FIG. 6, the touch key subassembly 50 adopts a self capacitance type touch key. Accordingly, choice of the touch key subassembly 50 can be diversified.

Unlike the exemplary embodiment shown in FIG. 1 to FIG. 4, in an exemplary embodiment shown in FIG. 7, the display assembly 100 comprises a display integrated circuit 10 and a touch integrated circuit 530, instead of the integrated circuit chip. The touch key subassembly 50 comprises a second inductive capacitor 510b and a second connection line 520b. The second connection line 520b has one end that is electrically connected with the second inductive capacitor 510b and the other end that is electrically connected with the touch integrated circuit 530. Thus, a both-way communication can be achieved between the second inductive capacitor 510b and the touch integrated circuit 530 via the second connection line 520b, so that the second inductive capacitor 510b can transmit input information to the touch integrated circuit 530, and the touch integrated circuit 530 can also drive and control the touch key subassembly 50. Provision of the touch integrated circuit 530 independently of the touch integrated circuit 10 is advantageous for improving the reliability and stability of the operation of the touch key subassembly 50.

In the description of the present specification, the description made after the reference terms "an embodiment", "some embodiments", "exemplary embodiment", "an example", "specific example", or "some examples", etc., indicates particular features, structures, materials or characteristics described in the embodiment(s) or example(s) are included in at least one embodiment or example of the present disclosure. In the present specification, the schematic representation of the above terms does not necessarily refer to the same embodiment or example. Furthermore, the particular features, structures, materials, or characteristics described may be combined in a suitable manner in any one or more embodiments or examples.

Although some embodiments of the present disclosure have been shown and described as above, it should be understood by those skilled in the art that, various changes, modifications, replacements and variations of the above-described embodiments may be made without departing from the spirit and scope of the present disclosure, and the scope of the present disclosure is defined by the claims and equivalents thereof.

What is claimed is:

1. An array substrate for a display assembly, the display assembly comprising a display region and a non-display region, the array substrate comprising a first portion located in the display region and a second portion located in the non-display region, wherein a touch key subassembly is provided within the second portion, wherein the display assembly comprises an integrated circuit chip; and
   the touch key subassembly comprises: a first inductive capacitor; and a first connection line having one end that is electrically connected with the first inductive capacitor and the other end that is electrically connected with the integrated circuit chip.

2. The array substrate for the display assembly of claim 1, further comprising a first ground line, wherein a first segment of the first ground line encircles the first inductive capacitor, a second segment of the first ground line is disposed around the first connection line, and the first connection line and the first ground line are covered with a protective glue.

3. The array substrate for the display assembly of claim 1, wherein the first connection line comprises a wiring of a thin film transistor array.

4. The array substrate for the display assembly of claim 1, wherein there are two touch key subassemblies spaced apart in a width direction of the array substrate, and the integrated circuit chip is between the two touch key subassemblies.

5. A display assembly comprising:
   an integrated circuit chip;
   the array substrate for the display assembly, according to claim 1, to which the integrated circuit chip is connected;
   an opposite substrate; and
   a protective board;
   wherein the protective board is attached to one side of the opposite substrate, and the array substrate is attached to the other side of the opposite substrate.

6. The display assembly of claim 5, wherein the array substrate further comprises a first ground line, wherein a first segment of the first ground line encircles the first inductive capacitor, a second segment of the first ground line is disposed around the first connection line, and the first connection line and the first ground line are covered with a protective glue.

7. The display assembly of claim 5, wherein the first connection line comprises a wiring of a thin film transistor array.

8. The display assembly of claim 5, wherein there are two touch key subassemblies spaced apart in a width direction of the array substrate, and the integrated circuit chip is between the two touch key subassemblies.

9. The display assembly of claim 6, further comprising a packing layer that is between the protective board and the array substrate and that comprises the protective glue and a packing material.

10. An electronic equipment comprising the display assembly of claim 5.

11. An array substrate for a display assembly, the display assembly comprising a display region and a non-display region, the array substrate comprising a first portion located in the display region and a second portion located in the non-display region, wherein a touch key subassembly is provided within the second portion, wherein the display assembly comprises a display integrated circuit and a touch integrated circuit independent of each other, and
the touch key subassembly comprises: a second inductive capacitor; and a second connection line having one end that is electrically connected with the second inductive capacitor and the other end that is electrically connected with the touch integrated circuit.

12. The array substrate for the display assembly of claim 11, further comprising a second ground line, wherein a first segment of the second ground line encircles the second inductive capacitor, a second segment of the second ground line is disposed around the second connection line, and the second connection line and the second ground line are covered with a protective glue.

13. The array substrate for the display assembly of claim 11, wherein the second connection line comprises a wiring of a thin film transistor array.

14. A display assembly comprising:
an integrated circuit chip;
the array substrate for the display assembly, according to claim 11, to which the integrated circuit chip is connected;
an opposite substrate; and
a protective board;
wherein the protective board is attached to one side of the opposite substrate, and the array substrate is attached to the other side of the opposite substrate.

15. The display assembly of claim 14, wherein the array substrate further comprises a second ground line, wherein a first segment of the second ground line encircles the second inductive capacitor, a second segment of the second ground line is disposed about the second connection line, and the second connection line and the second ground line are covered with a protective glue.

16. The display assembly of claim 15, further comprising a packing layer that is between the protective board and the array substrate and that comprises the protective glue and a packing material.

17. The display assembly of claim 14, wherein the second connection line comprises a wiring of a thin film transistor array.

18. An electronic equipment comprising the display assembly of claim 14.

* * * * *